United States Patent [19]

Lee

[11] 3,710,147

[45] Jan. 9, 1973

[54] TRANSISTOR SWITCHES FOR HIGH VOLTAGE APPLICATIONS

[75] Inventor: Martin David Lee, Lilliput Poole, England

[73] Assignee: Plessey Handel Und Investments A.G., Zug, Switzerland

[22] Filed: June 29, 1971

[21] Appl. No.: 158,005

[52] U.S. Cl. .................................. 307/246, 307/254

[51] Int. Cl. .............................................. H03k 17/56

[58] Field of Search ....................... 307/202, 254, 246

[56] References Cited

UNITED STATES PATENTS

| | | | |
|---|---|---|---|
| 3,424,948 | 1/1969 | Ravas | 307/202 |
| 3,297,928 | 1/1967 | Von Delden | 307/254 |
| 3,441,875 | 4/1969 | Shoh | 307/254 |
| 3,525,883 | 8/1970 | Iordanidis | 307/254 |
| 3,529,300 | 9/1970 | McDaniel | 307/254 |

*Primary Examiner*—Archie R. Borchelt
*Assistant Examiner*—Harold A. Dixon
*Attorney*—Alex Friedman et al.

[57] ABSTRACT

A high voltage switch arrangement comprising switches each defined by cascaded transistors connected effectively in the arms of a bridge for switching a high voltage across a capacitive load so that an a.c. voltage is supplied through the load when the bridge is fed from a d.c. source and the switches operated sequentially.

4 Claims, 7 Drawing Figures

TRANSISTOR SWITCHES FOR HIGH VOLTAGE APPLICATIONS

This invention relates to switching arrangements for reactive loads.

The use of transistors or other switchable semiconductor devices for high voltage switching applications is often avoided either because devices capable of working at a sufficiently high voltage are not commercially available or because the devices that are available are prohibitively expensive.

The present invention has for an object therefore to provide a switching arrangement utilizing semiconductor devices and suitable for switching current through reactive loads.

According to the present invention an electrical switching arrangement for switching current through a reactive load comprises, two serially connected switches each defined by a series of serially connected transistors operatively associated with biassing means and transformer control signal distribution means, whereby the contemporaneous switching of said devices from a conductive to a non-conductive state is facilitated said switches being arranged for switching alternately current through said load, at least some of said transistors being shunted by a capacitor of predetermined value the capacitance of said capacitors being chosen to be progressively larger towards one end of the series defining each switch, whereby voltages developed across the said transistors in operation of the said arrangement are substantially equalized.

In one embodiment of the invention four switches may be connected one in each arm of a bridge type circuit whereby a reactive load may be fed with pulses of current consequent upon sequential operation of the switches.

The switches may be operated simultaneously one pair being opened as another pair is closed so as to apply to the load a two level pulse signal.

Alternatively the switches may be operated sequentially in pairs one switch of a pair being opened and the other closed simultaneously so as to apply to the load a three or four level pulse signal.

It is also contemplated that two switches according to the invention may be used to apply alternately to a load two voltages one via each switch.

Switching arrangement according to the present invention are particularly useful for switching voltages across a capacitive reactive load and such switch arrangements may find application in light beam deflection circuits or modulators and for the switching of high voltages as may be associated with cathode ray tube circuitry, or transducers.

Some exemplary embodiments of the invention will now be described with reference to the accompanying drawings, in which.

Figure 1:
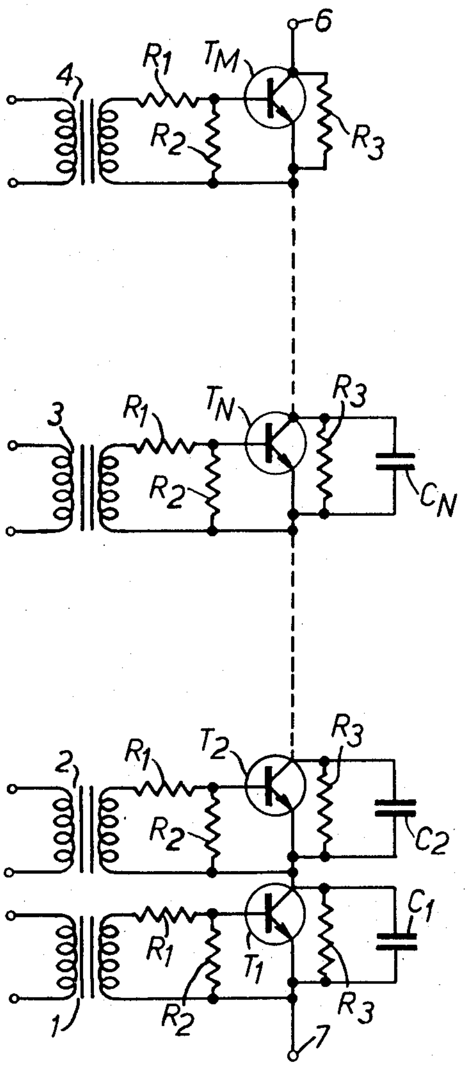
FIG. 1 is a circuit diagram of a switch according to the invention.

Referring now to FIG. 1, a switch according to the invention comprises a plurality of serially connected transistors only four of which $T_1$, $T_2$, $T_N$ and $T_M$ are shown. The transistors may be triggered into conduction simultaneously by pulses applied simultaneously to their respective bases via input transformers 1, 2, 3 and 4. The transistors are connected in series between terminals 6 and 7 and thus it will be appreciated that when all transistors are caused to conduct at the same time by appropriate signals applied to their bases from the transformers, the impedance between the terminals 6 and 7 will be a minimum. The transistors may be of a type suitable for operation in a straightforward switching mode or alternatively they may be of a type suitable for operation in an avalanche mode and in order to bias the transistors in accordance with their mode of operation, biasing resistors $R_1$ and $R_2$ are associated with each transistor.

When all the transistors are conducting the ON impedance between terminals 6 and 7 will be negligible but when the transistors are not conducting the OFF impedance is defined by a number of serially connected resistors $R_3$ connected in parallel one with each transistor where $R_3$ is much less than the off resistance of each transistor. Thus if the total number of transistors is M for example the OFF impedance of the switch will be defined as $MR_3$ ohms approximately, and if a voltage V is applied across the transistors then a voltage V/m will be in evidence across each transistor.

The transistors $T_1$, $T_2$, $I_N$ and $T_M$ etc. may be considered to react instantaneously to a switching pulse in a similar manner to a complex capacitive network approximating to a corresponding number of serially connected capacitors of difference values. Thus instantaneously the transistors may be considered to a first approximation, analogous to a capacitive potential divider. It will therefore be appreciated that the value of the base/collector voltage of a particular transistor during a switching operation will be determined by its position in the series chain and its effective capacitance in relation to the capacitance presented by the other transistors. In order to limit the base/collector voltage to a safe level, transistor $T_1$ is shunted by a capacitor $C_1$, transistor $T_2$ is shunted by a capacitor $C_2$ and transistor $T_N$ is shunted by a capacitor $C_N$. In this example transistor $T_M$ at one end of the chain is not shunted by a capacitor and capacitor $C_1$ is larger than capacitor $C_2$ and capacitor $C_2$ is larger than capacitor $C_N$. The value of each capacitor can be calculated in accordance with the number of transistors in a series chain and the effective capacitance of each transistor or determined by experiment. The arrangement of the capacitors $C_1$ to $C_N$ will later be discussed in connection with an application of the switch.

Figure 2:
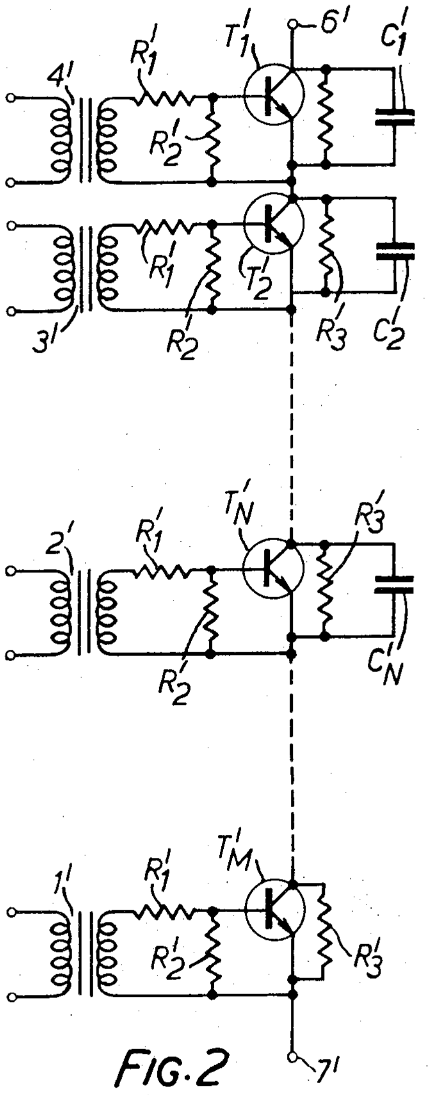
FIG. 2 is a circuit diagram of an alternative form of switch according to the invention.

Referring now to FIG. 2 a similar switch is shown the parts of which bear similar designations to those of FIG. 1 but are distinguished by a dashed suffix. The switch shown in this Figure is distinguished from the switch shown in FIG. 1 by the capacitor distribution between terminals 6' and 7'. In this example a largest capacitor $C_1'$ is connected across the transistor adjacent to the terminal 6' and a transistor $T_M'$ adjacent to the terminal 7' is not shunted by a capacitor at all.

The transformers 1 to 4 and 1' to 4' shown in FIGS. 1 and 2 respectively may be toroidally wound on linear ferrite cores. The primary windings of the transformers may be connected in series and supplied with appropriate pulses of current to switch their associated transistors or alternatively they may be connected in parallel across a pair of control signal supply lines. According to an alternative arrangement one transformer may be provided with individual secondary windings one for each transistor the pulses being applied to the transformer through a single primary winding.

In order to maintain a current between the terminals 6 and 7 it will be appreciated that repetitive pulse trains must be fed into the transformers to maintain the switches in an ON condition.

Figure 3:
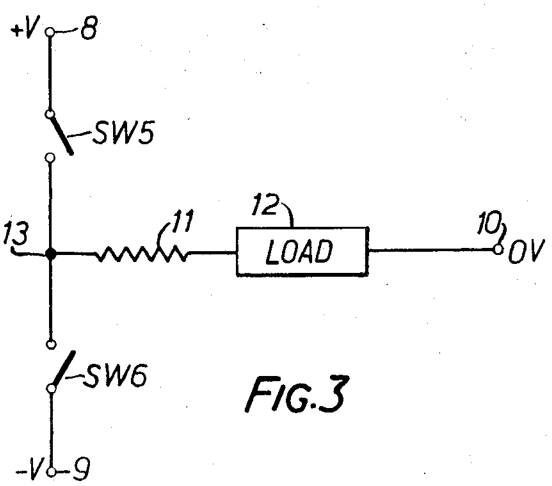
FIG. 3 is a circuit diagram of a switching arrangement incorporating switches as shown in FIGS. 1 and 2.
Figure 4:
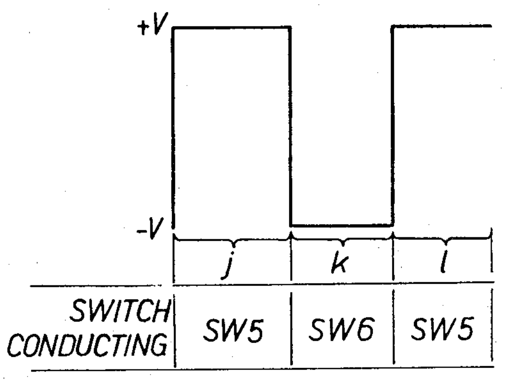
FIG. 4 is a waveform diagram illustrating the operation of the circuit arrangement shown in FIG. 3.

In order to switch a voltage across a capacitive load a switching arrangement as shown in FIG. 3 may be utilized. In this arrangement a voltage $+v$ is applied at terminal 8, and a voltage $-v$ is applied at terminal 9, the voltages being measured with respect to a zero potential present on a terminal 10. The voltages $+v$ and $-v$ may or may not be the same and the potential on terminal 11 need not be zero. Switches $SW_5$ and $SW_6$ are operated alternately effectively in a push pull mode to connect the voltages $+v$ and $-v$ respectively through a load dissipating resistor 11 to a capacitive load 12. In this example, switch $SW_5$ is of the kind described with reference to FIG. 1 and switch $SW_6$ is as described with reference to FIG. 2 such that in switch $SW_5$, a transistor corresponding to transistor T1 which is shunted by a capacitor corresponding to capacitor C1 is connected adjacent a point 13 in the circuit between the switches $SW_5$ and $SW_6$ and in switch $SW_6$ a transistor corresponding to transistor T1' shunted by capacitor C1' is also connected at this point 13. Thus since these transistors which are nearest to the point 13 are liable to be subjected to the highest instantaneous collector/base voltages they are shunted by the largest compensating capacitors C1 and C1' respectively. Thus the more remote a transistor is from the point 13 the smaller may be its shunt capacitor. The voltage developed across the terminal 10 and point 13 will be as shown in FIG. 4. With the switch $SW_5$ only conducting during the periods J and L the voltage across the load will be +V voltage and when switch $SW_5$ is non-conducting and switch $SW_6$ is conductive the voltage during period K will be $-V$. It will be appreciated that although the voltage during each conduction period is shown as continuous the transistors of the appropriate ON switch will be pulsed repetitively.

Figure 5:
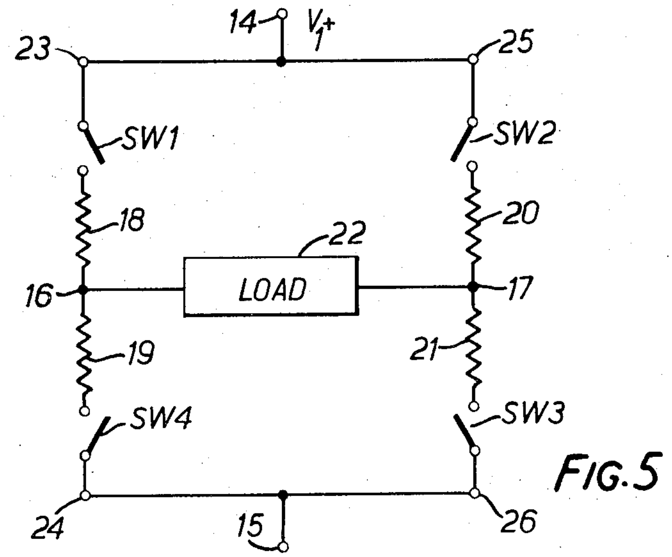
FIG. 5 is a circuit diagram of another switching arrangement incorporating switches as shown in FIGS. 1 and 2, and FIGS. 6 and 7 are waveform diagrams illustrating various modes of operation of the circuit arrangement shown in FIG. 5.

An alternative arrangement is shown in FIG. 5 and comprises four switches SW1, SW2, SW3 and SW4 connected in the arms of a bridge. A voltage +V1 is applied between the terminals 14 and 15 of the bridge and a capacitive load is connected between terminals 16 and 17. Since the load is capacitive small resistors 18, 19, 20 and 21 are provided one in each arm which limit the initial switch current, and dissipate a proportion of the stored energy in the capacitive load. It will be appreciated that instead of the resistors 19 to 21 a single resistor may be provided in series with the load as shown in FIG. 3, the value being chosen with rise time requirements. Thus it will also be appreciated that instead of the resistor 11 in series with the load as shown in FIG. 3 two resistors could have been provided, one in series with each switch $SW_5$ and $SW_6$. The arrangement shown in FIG. 5 may be operated effectively in push-pull either in accordance with a mode as illustrated by the waveform diagram of FIG. 6 or in accordance with a mode as illustrated by the waveform diagram of FIG. 7.

Figure 6:
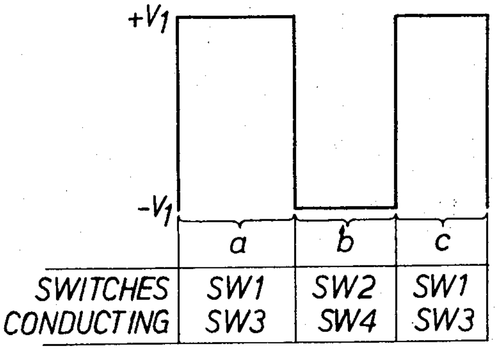

A useful property of push-pull operation in circuits according to the invention is that the turning on of one switch actively pulls off an operatively adjacent switch maintained on just previously by charge storage. Thus by suitable timing, charge storage is used such that transition speed is a function only of the rise-time of one switch driving a capacitive load rather than a function of fall-time or switch decay time. This rise-time is very much faster than the decay time. In FIG. 6 it is clear that the switches are operated simultaneously such that when switch SW1 and SW3 are conducting switches SW2 and SW4 are non-conducting. Thus the voltage present between terminals 16 and 17 across capacitive load 22 will be +V1 when switches SW1 and SW3 are conducting during periods *a* and *c* and −V1 when switches SW2 and SW4 are conducting during period *b*, as shown in FIG. 6.

Figure 7:
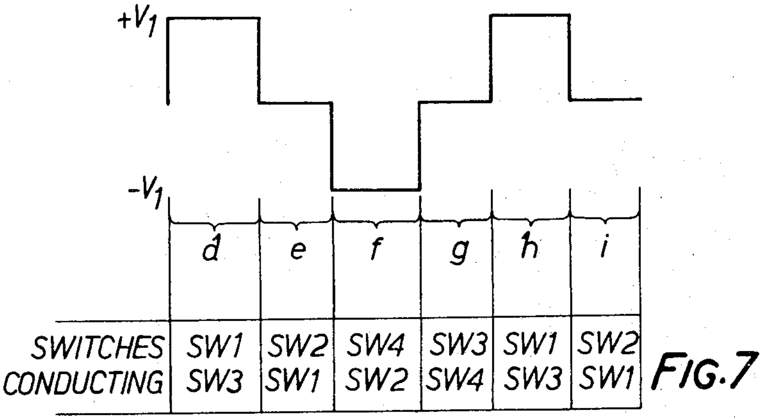

Alternatively the switches may be operated sequentially in pairs one switch being opened as another is closed. Thus as shown in FIG. 7 when switches SW1 and SW3 are conducting the voltage across the load is +V1. Switch SW3 is then rendered non-conductive and switch SW2 rendered conductive simultaneously so that the voltage across the load 22 falls to zero. The voltage across the load 22 is reversed by causing switch SW4 to be conductive and switch SW1 to stop conducting. The switches conducting during conduction periods *d*, *e*, *f*, *g*, *h* and *i* are clearly shown in the waveform diagram of FIG. 7. By operating the switches sequentially in pairs a three level pulse signal may be applied across the load as shown in FIG. 7. This arrangement has the advantage that the power dissipated in switching between +V and −V is only half the power dissipated in the arrangement described with reference to FIG. 6 assuming that the frequency of operation is the same in each case.

It will be appreciated that although in this example both series arms of the bridge have the same voltage applied to them it would clearly be possible to apply one voltage between the bridge arms connected in series between terminals 23 and 24 and another different voltage between the bridge arms connected in series between terminals 25 and 26. It is apparent that under these conditions links between terminals 23 and 25 and between terminals 24 and 26 would across be removed. With this arrangement it is possible to get an asymmetrical voltage swing across the load, which may for some applications be required.

Although in the foregoing examples a capacitive load has been used it will be appreciated that other loads may be substituted.

The switches and switch arrangements as hereinbefore described have many applications but one particular application is in a light beam deflector using electro-optic crystals which require voltages of the order of 3 to 4kV to be switched across the crystal which constitutes a capacitive load at rates of $10^6$ times per second.

The high voltages required for electro-optic crystals as described in "A Review of Electro-Optic Beam Deflection Techniques" by J.C. Bass, The Radio and Electronic Engineer. December 1967, Vol. 34. No. 6 and "A Solid State Subnanosecond Light Switch" by J.M. Ley, T.M. Christmas and C.G. Wildey, Proc. IEE June 1970, Vol. 177 No. 6, have tended to impose severe limitations on the operating speed of digital light beam deflectors using electro-optic crystals. The use of known techniques such as those published in "Biased Resonance Circuits for Electro-Optic Digital Deflectors," by C.F. Haugh, Applied Optics. November 1966. Vol. 5. No.11; "An N-Stage Series Transistor Circuit" by K.H. Beck, Trans. I.R.E. March 1956, Vol. CT–3. No.1. and "Switching 1kV with Transistors" by C.L. Hopkins, EEE - Circuit Design Engineering. October 1966, for switching these high voltages have tended to give waveforms far from ideal as explained in "Broadband Laser Display System" by S. Leroy Everett Jr., United States Army Electronics Command: Research and Development Technical Report. ECON – 2937. January 1968. This problem would have been alleviated if suitable new materials had been developed with low half wave voltages and if these had become available for use in deflectors. As no suitable new materials have appeared, acousto-optic deflectors have on the whole been used in electro-optic systems applications requiring high speed light deflectors.

Of the available electro-optic materials KD*P, which can be obtained in quantity with sufficient optical quality, remains the most practical for digital light deflectors. In this application KD*P crystals are used most often in the z-cut longitudinal mode as polarization switches. These alternate with suitable bi-refringent elements which produce the digital deflection.

The voltage waveforms which are required across the electro-optic crystals are ideally rectangular. Approximations to this are of course acceptable. The edges must be fast: switching times compatible with those of integrated logic circuitry would be desirable. Similarly switching rate in the megahertz region would be useful. Peak to peak voltages must be equal to the half-wave voltage of the electro-optic crystals and voltage definition of better than 5 percent is necessary for satisfactory extinction in deflector stages.

The effective half-wave voltage of KD*P in a digital electro-optic deflector depends on the wavelength of the light used, the crystal alignment, the temperature, the degree of deuteration of the crystals and the type of electrodes used. In the region of 20°C, with light at 632.8 nm, using conducting Stannic Oxide electrodes on transparent substrates, glued to the crystal, the half-wave voltage of KD*P is between 3.8 and 4.2 kV. The circuits herebefore described in accordance with the invention will effectively switch these voltages with transition times of 200 ns at rates up to 1.2 million times per second. They are all solid state using transistors as the active devices. They are powered by a supply which uses solid state voltage stabilization and allows individual adjustments to be made to the voltages switched across each stage in a multi-stage digital light deflector. The high voltage switching circuits use 450 volt transistors. Although transistors are available with breakdown voltages as high as 1.5 kV, these are slower and not suitable for fast switching. The transistors used in circuits according to the invention are stacked to effectively multiply their breakdown voltage. Circuits have been developed in the past to do this but these have required slowing down circuits to ensure simultaneous switching of all the transistors. The circuits hereinbefore described in this paper exploit several useful transistor characteristics, some of which are normally a drawback, and do not require slowing down circuits. These circuits also switch in a time which is a function of the transistor rise-time, not fall-time, which is usually slower. The performance of these circuits makes them ideal for driving high speed light deflectors.

Twelve of these circuits have been used to drive ten stages of a digital light deflector and two modulators in a random access holographic read-only computer memory. In this system, the deflector will change state in periods as short as 200 nanoseconds. One of the modulators which also used z-cut KD*P operates continuously at 312.5 kHz, equivalent to a deflector stage operating at 625 kHz. Reliable operation of this system has now been obtained for over 1,000 hours. The switch lifetime is expected to be similar to that of all normal low voltage solid state systems.

An electro-optic modulator which uses two z-cut KD*P crystals connected optically in series, electrically in parallel, may conveniently be driven by using a switching sequence as described with reference to FIGS. 5 and 7. Very fast rise times and high repetition rates are afforded by use of switch arrangements according to the invention and high reliability is offered in view of the solid state nature of the device which facilitates a rugged construction.

What we claim is:

1. An electrical switching arrangement for switching current through a reactive load comprising two serially connected switches each defined by a series of serially connected transistors operatively associated with biassing means and transformer control signal distribution means whereby the contemporaneous switching of said devices from a conductive to a non-conductive state is facilitated, said switches being arranged for switching alternately current through said load, at least some of said transistors being shunted by a capacitor of predetermined value, the capacitance of said capacitors being chosen to be progressively larger towards one end of the said series defining each switch, whereby voltages developed across the said transistors in operation of said arrangement are substantially equalized.

2. An arrangement as claimed in claim 1 wherein each transistor is shunted by a resistor.

3. An electrical switching system including four switch arrangements as claimed in claim 2 connected one in each arm of a four branch circuit the arrangement being such that the supply of pulses of current to a load is facilitated consequent upon sequential operation of the switch arrangement.

4. An electrical switching system as claimed in claim 3, wherein the four branch circuit is in the form of a bridge.

* * * * *